(12) United States Patent
Hu et al.

(10) Patent No.: US 7,625,687 B2
(45) Date of Patent: Dec. 1, 2009

(54) SILSESQUIOXANE RESIN

(75) Inventors: Sanlin Hu, Midland, MI (US); Eric Scott Moyer, Midland, MI (US); Sheng Wang, Midland, MI (US); David Lee Wyman, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 436 days.

(21) Appl. No.: 10/555,594

(22) PCT Filed: Jun. 30, 2004

(86) PCT No.: PCT/US2004/020888

§ 371 (c)(1),
(2), (4) Date: Jul. 10, 2006

(87) PCT Pub. No.: WO2005/007747

PCT Pub. Date: Jan. 27, 2005

(65) Prior Publication Data

US 2007/0281242 A1    Dec. 6, 2007

Related U.S. Application Data

(60) Provisional application No. 60/484,695, filed on Jul. 3, 2003, provisional application No. 60/491,073, filed on Jul. 30, 2003.

(51) Int. Cl.
*G03F 7/039* (2006.01)
*G03F 7/20* (2006.01)
*G03F 7/30* (2006.01)
*G03F 7/38* (2006.01)
*C08G 77/12* (2006.01)

(52) U.S. Cl. ............ 430/270.1; 430/905; 430/326; 430/330; 430/914; 430/919; 430/921; 430/925; 430/942; 528/12; 528/10; 528/20; 528/25; 528/26; 528/31

(58) Field of Classification Search ............. None
See application file for complete search history.

(56) References Cited

U.S. PATENT DOCUMENTS

| 3,615,272 | A | 10/1971 | Collins et al. ............ 23/366 |
| 4,999,397 | A | 3/1991 | Weiss et al. ............ 524/755 |
| 5,010,159 | A | 4/1991 | Bank et al. ............ 528/23 |
| 6,303,268 | B1 | 10/2001 | Namba et al. ............ 430/270.1 |
| 6,353,074 | B1 | 3/2002 | Carpenter, II et al. ...... 528/23 |
| 2002/0081520 | A1 | 6/2002 | Sooriyakumaran et al. ........ 430/270.1 |
| 2002/0090572 | A1 | 7/2002 | Sooriyakumaran et al. ........ 430/271.1 |
| 2002/0143132 | A1 | 10/2002 | Kobayashi et al. ........ 528/10 |
| 2003/0152784 | A1 | 8/2003 | Deis et al. ............ 428/447 |
| 2005/0215713 | A1* | 9/2005 | Hessell et al. ............ 525/162 |

FOREIGN PATENT DOCUMENTS

| EP | 1 142 928 | 2/2004 |
| WO | WO 02/091083 | 11/2002 |
| WO | WO 03/063225 | 7/2003 |

OTHER PUBLICATIONS

JP63-107122, 19980512, Levelling uneven surface of substrate-by dissolving silicone resin in solvent painting on substrate and heating, for forming semiconductor, (1998).
JP60-86017, 19850515, Polyhydrogen silsesquioxane prodn.-by hydrolysing soln. of trichlorosilane, (1985).
JP59-178749, 19841011, Wiring structure in semiconductor devices, bubble memory devices, etc. (1984).

* cited by examiner

*Primary Examiner*—Sin J. Lee
(74) *Attorney, Agent, or Firm*—Sharon K. Brady

(57) ABSTRACT

This invention pertains to a silsesquioxane resin with improved lithographic properties (such as etch-resistance, transparency, resolution, sensitivity, focus latitude, line edge roughness, and adhesion) suitable as a photoresist; a method for in-corporating the fluorinated or non-fluorinated functional groups onto silsesquioxane backbone. The silsesquioxane resins of this invention has the general structure $(HSiO_{3/2})_a(RSiO_{3/2})_b$ wherein; R is an acid dissociable group, a has a value of 0.2 to 0.9 and b has a value of 0.1 to 0.8 and $0.9 \leq a+b \leq 1.0$.

61 Claims, No Drawings

SILSESQUIOXANE RESIN

CROSS REFERENCE TO RELATED APPLICATIONS

This application is a U.S. national stage filing under 35 U.S.C. §371 of PCT Application No. PCT/US2004/020888 filed on Jun. 30, 2004, currently pending, which claims the benefit of U.S. Provisional Patent Application No. 60/484,695 filed Jul. 3, 2003 and U.S. Provisional Patent Application No. 60/491,073 filed Jul. 30, 2003 under 35 U.S.C. §119 (e). PCT Application No. PCT/US2004/020888 and U.S. Provisional Patent Application Nos. 60/484,695 and 60/491,073 are hereby incorporated by reference.

Lithography with 157 nm F2 laser is rapidly emerging as a viable technology for the post 193 mm era. In fact, it may become the technology of choice for 100 to 70 mm nodes. However, most of the existing photoresists used today have a strong absorption at the wavelength of 157 nm. Certain fluorocarbon polymers and silicon-containing polymers including silsesquioxanes have shown high transparency at 157 nm.

One of the key chemicals used for IC manufacturing is photoresist (PR), a photosensitive polymer that masks portion of substrate & transfers IC patterns w/high integrity when properly exposed & developed. Building faster & smaller processors calls for resists that meet stricter requirements: high transparency; thinner film; better adhesion; higher etch resistance & thermal stability; faster photo-induced sensitivity. However, design and development of such materials is a significant challenge since most known photoresists, water, oxygen, and simple hydrocarbons, all absorb strongly in the spectral range.

Due to its unique structure and high content of Si—H bonds, hydrogen silsesquioxane (HSQ) is remarkably transparent at both 193 nm and 157 nm. HSQ (commercialized by Dow Corning under the trade name FOX®) has been widely used as spin-on low-k dielectric materials, which already posses certain characteristics required as a good photoresist, such as thin film quality, thermal and mechanical properties. It is also believed that in the base aqueous solution (like in the commonly used developer, tetra-methyl ammonium hydroxide (TMAH)) the Si—H bond is rapidly converted to a Si—OH moiety, which is base soluble. However it is very difficult, if not impossible, to directly incorporate any acid-labile functional groups onto the HSQ backbone to make HSQ useful as a photoresist.

This invention pertains to a functionalized silsesquioxane resin with high Si-content and improved properties (such as high etch-resistance and high transparency) suitable as a photoresist for microlithographic applications at 193 nm and 157 nm and other wavelengths; a method for incorporating the fluorinated or non-fluorinated functional groups onto silsesquioxane backbone. The silsesquioxane resins of this invention have the general structure $(HSiO_{3/2})_a(RSiO_{3/2})_b$ wherein; R is an acid dissociable group, a has a value of 0.2 to 0.9 and b has a value of 0.1 to 0.8 and $0.9 \leq a+b \leq 1.0$. Alternatively a has a value of 0.4 to 0.8 and b has a value of 0.2 to 0.6. It is believed because of the high content of SiH in the resin that the resists are more transparent (low OD) at 193 nm and 157 nm with higher sensitivity to the light, and because of the high Si content (up to 40 wt %) in the resin with Si—O bond in the main chain, therefore the resists comprising of the silsesquioxane resins of this invention have superior etch resistance, and low (or no) outgassing.

This invention also pertains to silsesquioxane resins having the general formula $(HSiO_{3/2})_a(RSiO_{3/2})_b(HSi(OR^1)O_{2/2})_c$ wherein R, a and b are as described above and $R^1$ is selected from H or a linear or branched $C_1$ to $C_6$ alkyl group and c has a value of 0.01 to 0.4, alternatively 0.05 to 0.15 and $0.9 \leq a+b+c \leq 1.0$. It is believed that the presence of $HSi(OR^1)O_{2/2}$ units improves the adhesion of the resin to the substrate when the resin is used as a resist.

This invention also pertains to silsesquioxane resins having the general formula $(HSiO_{3/2})_a(RSiO_{3/2})_b(Si(OR^1)_xO_{(4-x)/2})_d$ where R, $R^1$, a and b are described above, d has a value of 0.05 to 0.45, alternatively 0.1 to 0.25, $0.9 \leq a+b+d \leq 1.0$, and x has a value of 0 to 3. It is believed that the presence of $Si(OR^1)_xO_{(4-x)/2}$ units enhances the thermo-stability of the resin and affords higher Tg, and therefore improves the resist's resolution, contrast, line-edge roughness (LER), etc.

This invention also pertains to silsesquioxane resins having the general structure $(HSiO_{3/2})_a(RSiO_{3/2})_b(R^2SiO_{3/2})_e$ where R, a, and b are as described previously, $R^2$ is a property (performance) modifying functional group, e has a value of 0.01 to 0.25, alternatively 0.05 to 0.15 and $0.9 \leq a+b+e \leq 1.0$. The $R^2$ group is used to modify properties such as the adhesion or Tg.

This invention also pertains silsesquioxane resins having the general structure $(HSiO_{3/2})_a(RSiO_{3/2})_b(HSi(OR^1)O_{2/2})_c(R^2SiO_{3/2})_e$ wherein R, $R^1$, $R^2$, a, b, c and e are as described above and $0.9 \leq a+b+c+e \leq 1.0$.

This invention also pertains silsesquioxane resins having the general structure $(HSiO_{3/2})_a(RSiO_{3/2})_b(Si(OR^1)_xO_{(4-x)/2})_d(R^2SiO_{3/2})_e$ wherein R, $R^1$, $R^2$, a, b, d and e are as described above and $0.9 \leq a+b+d+e \leq 1.0$.

This invention also pertains to silsesquioxane resins having the general structure $(HSiO_{3/2})_a(RSiO_{3/2})_b(HSi(OR^1)O_{2/2})_c(Si(OR^1)_xO_{(4-x)/2})_d$ where R, $R^1$, a, b, c, d, and x are described above and $0.9 \leq a+b+c+d \leq 1.0$ This invention also pertains to silsesquioxane resins having the general structure $(HSiO_{3/2})_a(RSiO_{3/2})_b(HSi(OR^1)O_{2/2})_c(Si(OR^1)_xO_{(4-x)/2})_d(R^2SiO_{3/2})_e$ where R, $R^1$, $R^2$, a, b, c, d, e and x are described above and $0.9 \leq a+b+c+d+e \leq 1.0$ This invention also pertains to silsesquioxane resins having the general structure $(HSiO_{3/2})_a(RSiO_{3/2})_b(HSi(OR^1)O_{2/2})_c(Si(OR^1)_xO_{(4-x)/2})_d(R^2SiO_{3/2})_e(SiO_{4/2})_f$ where $0.0 \leq f \leq 0.20$; R, $R^1$, a, b, c, d, e and x are described above and $0.9 \leq a+b+c+d+e+f \leq 1.0$.

The silsesquioxane resins of this invention are not only highly transparent at low wavelength, but also satisfy numerous other requirements for a positive resist, such as exceptional etch-resistance, adhesion to various substrates, thermostability for wide-window of processes, chemically-amplifiable, aqueous-base solubility upon photo deprotection, and so on.

The silsesquioxane resins of this invention contain $HSiO_{3/2}$ units and $RSiO_{3/2}$ units where R is an acid dissociable group. By "acid dissociable group" it is meant a molecular moiety that is cleavable with acid, particularly photogenerated acid (PAG). Acid dissociable groups are known in the art and are described, for example, in European Patent Application No. 1142928 and U.S. Patent Application Publication No. 2002/0090572, herein incorporated by reference for its teaching of acid dissociable groups. In particular, the acid dissociable groups (R) can be described by the formula:

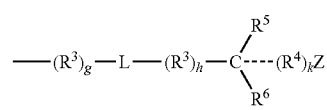

wherein each $R^3$ are independently a linking group, $R^4$ a second linking group;

L is selected from the group consisting of linear or branch alkylene groups having 1 to 10 carbon atoms, fluoroalkylene groups having 2 to 20 carbon atoms, substituted and unsubstituted arylene groups, substituted and unsubstituted cycloalkylene groups, and substituted and unsubstituted alkarylene groups;

$R^5$ is hydrogen, linear or branched alkyl or fluoroalkyl;

$R^6$ is alkyl or fluoroalkyl;

Z is an acid-cleavable group;

g may have a value of 0 or 1 h may have the value of 0 or 1; and k may have the value of 0 or 1.

Each $R^3$ may be exemplified by, but not limited to, an alkylene group such as methylene and ethylene.

$R^4$ may be exemplified by, but not limited to, linear or branched alkylene groups, cycloalkylene groups such as norbornyl or cyclohexylene, fluoroalkylene groups, and aryl groups.

L may be exemplified by, but not limited to, substituted (e.g. fluorinated) and unsubstituted methylene, ethylene, norbornene, cycloalkylene and alkarylene moieties.

$R^5$ may be exemplified by, but not limited to hydrogen, $C_1$ to $C_6$ alkyl groups such as methyl and ethyl and $C_1$ to $C_6$ fluoroalkyl groups such as trifluoromethyl, 2,2,2-trifluoroethyl and 3,3,3-trifluoromethyl.

$R^6$ may be exemplified by, but not limited to, $C_1$ to $C_6$ alkyl groups such as methyl and ethyl and $C_1$ to $C_6$ fluoroalkyl groups such as trifluoromethyl, 2,2,2-trifluoroethyl and 3,3,3-trifluoromethyl.

Z may be exemplified by, but not limited to, —OH, —COOH, esters of the formula —$COOR^7$, carbonates of the formula —$OCOOR^8$, ethers of the formula —$OR^9$, wherein $R^7$, $R^8$ and $R^9$ are selected to render the functionality acid-cleavable.

In the acid dissociable group —$COOR^7$, $R^7$ may be a tertiary alkyl, e.g., t-butyl, a cyclic or alicyclic substituent (generally $C_7$-$C_{12}$) with a tertiary attachment point such as adamantyl, norbornyl, isobornyl, 2-methyl-2-adamantyl, 2-methyl-2-isobornyl, 2-butyl-2-adamantyl, 2-propyl-2-isobornyl, 2-methyl-2-tetracyclododecenyl, 2-methyl-2-dihydrodicyclopentadienyl-cycl-ohexyl, 1-methylcyclopentyl or 1-methylcyclohexyl, or a 2-trialkylsilylethyl group, such as 2-trimethylsilyethyl, or 2-triethylsilylethyl.

Carbonate acid dissociable groups having the formula —$OCOOR^8$ may be exemplified by —O-t-butoxycarbonyl (i.e. $R^8$ is t-butyl). Ether acid dissociable groups having the formula —$OR^9$ may be exemplified by tetrahydropyranyl ether (i.e. $R^9$ is tetrahydropyranyl) and trialkylsilyl ethers (i.e. $R^9$ is a trialkylsilyl such as trimethylsilyl).

Typical Z groups are organic ester groups that undergo a cleavage reaction in the presence of a photogenerated acid to generate a carboxylic acid group.

Acid dissociable groups, R, may be exemplified by, but not limited to 1,1 dimethylethyl, isopropyl, 2-methyladamantyl, 2-ethyladamantyl, cyclohexyl, and 2-hydroxy-3-pinanyl or t-butyl ester of norbornane, and others.

In addition to the $(HSiO_{3/2})$ and $(RSiO_{3/2})$ units, the silsesquioxane resins may additionally contain $HSi(OR^1)O_{2/2}$ units, or $Si(OR^1)_xO_{(4-x)/2}$ units, or $(R^2SiO_{3/2})$ or $(SiO_{4/2})$ units or any combination of theses units to enhance the performance of the silsesquioxane resin. In these units each $R^1$ is independently selected from H or a $C_1$ to $C_6$ alkyl group. $R^1$ may be exemplified by, but not limited to methyl, ethyl, propyl, butyl, t-butyl and others. Typically $R^1$ is H or methyl. $R^2$ is selected from the group consisting of moieties having the following structure —$R^{21}R^{22}$, Where $R^{22}$ is typically —OH or —COOH, or a base-soluble moiety, and $R^{21}$ is a substituted and/or unsubstituted $C_1$ to $C_{12}$ (linear, branched or cyclic) alkyl moieties. $R^2$ may be exemplified by, but not limited to bicyclo[2,2,1]hept-5-ene-2-1,1,1-trifluoro-2-trifluoromethylpropane-2-ol; 2-trifluoromethyl bicyclo[2,2,1]hept-5-en-2-ol, 3,3,3-trifluoropropane-2-ol; and 2-trifluoromethyl-3,3-difluoro-bicyclo[2,2,1]hept-5-en-2-ol.

Typically the silsesquioxane resin will contain 5 to 40 mole % of the $HSi(OR^1)O_{2/2}$ units and more typically 5 to 15 mol % based on all units in the silsesquioxane resin. Additionally, the silsesquioxane resin may contain 5 to 45 mol % of $Si(OR^1)_xO_{(4-x)/2}$ units and more typically 10 to 25 mol % based on all units in the silsesquioxane resin. Further, the silsesquioxane resin may contain 0 to 25 mol % of $(R^2SiO_{3/2})$ units, alternatively 5 to 15 mol % based on all units in the silsesquioxane resin.

The silsesquioxane resins may be exemplified by but not limited to:

$(HSiO_{3/2})_a(RSiO_{3/2})_b$ where R is isopropyl, 2-methyladamantyl, cyclohexyl, 2-hydroxy-3-pinanyl or t-butyl ester of norbornane and a has a value of 0.2 to 0.9 and b has a value of 0.1 to 0.8;

$(HSiO_{3/2})_a(RSiO_{3/2})_b(R^1OSiO_{3/2})_c(SiO_{4/2})_f$ where R is isopropyl, 2-methyladamantyl, cyclohexyl, 2-hydroxy-3-pinanyl or t-butyl bicyclo[2,2,1]heptane-2-carboxylate; $R^1$ is H; a has a value of 0.3 to 0.7, b has a value of 0.2 to 0.50, c has a value of 0.05 to 0.2 and f has a value of 0.01 to 0.1

$(HSiO_{3/2})_a(RSiO_{3/2})_b(HSi(OR^1)O_{2/2})_c(Si(OR^1)_xO_{(4-x)/2})_d(R^2SiO_{3/2})_e$ where R is isopropyl, 2-methyladamantyl, cyclohexyl, 2-hydroxy-3-pinanyl or t-butyl bicyclo[2,2,1]heptane-2-carboxylate; $R^1$ is H; $R^2$ is bicyclo[2,2,1]hept-5-ene-2-(1,1,1-trifluoro-2-trifluoromethylpropane -2-ol, 2-trifluoromethyl bicyclo[2,2,1]hept-5-en-2-ol, 3,3,3-trifluoropropane-2-ol, 2-trifluoromethyl-3,3-difluoro-bicyclo[2,2,1]hept-5-en-2-ol; a has a value of 0.4 to 0.6, b has a value of 0.2 to 0.45, c has a value of 0.05 to 0.20, d has a value of 0.01 to 0.15, and e has a value of 0.01 to 0.25.

The silsesquioxane resins of this invention may be prepared by reacting (A) a hydrogen silsesquioxane resin having the formula $(HSiO_{3/2})_m(HSi(OR^1)O_{2/2})_n(Si(OR^1)_xO_{(4-x)/2})_p$ where m has a value of 0.7 to 1.0, typically 0.8 to 0.9 and n has a value of 0 to 0.4, typically 0.05 to 0.3, p has a value of 0 to 0.45 and $0.9 \leq m+n+p \leq 1.0$, typically $m+n+p \approx 1.0$ with (B) an acid dissociable group precursor to produce (C) the silsesquioxane resin having the general formula $(HSiO_{3/2})_{m1}(RSiO_{3/2})_{m2}(HSi(OR^1)O_{2/2})_n(Si(OR^1)_xO_{(4-x)/2})_p$ where $R^1$, n, p and x are as described previously, R is an acid dissociable group; m2 has a value of 0.1 to 0.6, typically 0.2 to 0.4; and $m1+m2 \approx m$.

Methods for preparing hydrogen silsesquioxane resins (A) are known in the art. One method involves the hydrolysis of trihalosilanes such as trichlorosilane or trialkoxysilanes such as triethoxysilane. Methods for preparing hydrogen silsesquioxane resins may be found in, but are not limited to those in, U.S. Pat. No. 3,615,272 to Collins et al., U.S. Pat. No. 5,010,159 to Bank et al., U.S. Pat. No. 4,999,397 to Frye et al., U.S. Pat. No. 6,353,074 to Carpenter et al., U.S. patent application Ser. No. 10/060,558 filed Jan. 30, 2002 and Japanese Patent Kokai Nos. 59-178749, 60-86017 and 63-107122;

The hydrogen silsesquioxane resin is reacted with (B) an acid dissociable group precursor. One method for reacting the hydrogen silsesquioxane resin and acid dissociable group precursor comprises the catalytic hydrosilylation of the acid dissociable group precursor and hydrogen silsesquioxane resin.

Acid dissociable group precursors may be exemplified by, but not limited to, t-butyl ester of norbornene, t-butyl-2-trifluoromethyl acrylate, t-butyl methacrylate, bicyclo[2,2,1]hept-5-ene-2-t-butylcarboxylate, cis-5-norbornene-2,3-dicarboxylic anhydride, and others. Typically the amount of acid dissociable group precursor is added in an amount to provide 5 to 60 mole % of $RSiO_{3/2}$ units in the silsesquioxane resin based on all units in the silsesquioxane resin, alternatively 15 to 40 mol %.

Hydrosilylation catalysts are well known in the art and may be exemplified by, but not limited to, platinum- or nickel- or rhodium-containing compounds. Examples of platinum-containing compounds include $H_2PtCl_6$, di-μ.-carbonyldi-.π.-cyclopentadienyldinickel, a platinum-carbonyl complex, a platinum-divinyltetramethyldisiloxane complex, a platinum cyclovinylmethylsiloxane complex and platinum acetylacetonate (acac). An example of a rhodium-containing compound is $Rh(acac)_2(CO)_2$ and an example of a nickel-containing compound is $Ni(acac)_2$. Typically the amount of hydrosilylation catalyst used is in the amount of 10 to 10,000 ppm alternatively 100 to 1,000 ppm based on the amount of reactants (i.e. hydrogen silsesquioxane resin and acid dissociable group precursor).

The reaction between the hydrogen silsesquioxane resin and acid dissociable group precursor is typically carried out at room temperature and pressure although heat or pressure may be used to facilitate the reaction.

The reaction between the hydrogen silsesquioxane and the acid dissociable group precursor is typically carried out in the presence of a solvent. The solvent may be exemplified by, but not limited to, alcohols such as ethyl alcohol or isopropyl alcohol; aromatic hydrocarbons such as benzene or toluene; alkanes such as n-heptane, dodecane or nonane; ketones such as methyl iso-butyl ketone; esters; glycol ethers; siloxanes such as cyclic dimethylpolysiloxanes and linear dimethylpolysiloxanes (e.g. hexamethyldisiloxane, octamethyltrisiloxane and mixtures thereof) 2-ethoxyethanol, propylene glycol methyl ether acetate (PGMEA), cyclohexanone, and 1,2-diethoxyethane, and others. Methyl iso-butyl ketone is typically used. The solvent may be the same solvent used to produce the hydrogen silsesquioxane resin.

The reaction between the hydrogen silsesquioxane resin and acid dissociable group precursor is typically carried out for a time sufficient to react essentially all of the acid dissociable group precursor with the hydrogen silsesquioxane resin. However to increase the molecular weight of the silsesquioxane resin and/or to improve the storage stability of the silsesquioxane resin the reaction may be carried out for an extended period of time with heating from 40° C. up to the reflux temperature of the solvent ("bodying step"). The bodying step may be carried out subsequent to the reaction step (b) or as part of the reaction step (b). Typically, bodying step is carried out for a period of time in the range of 30 minutes to 36 hours, more preferably 1 to 6 hours.

Silsesquioxane resins containing $R^2SiO_{3/2}$ units are prepared by reacting the hydrogen silsesquioxane resin (A) or silsesquioxane resin (C) with a functional group precursor. Typically the hydrogen silsesquioxane resin or silsesquioxane resin is reacted with the functional group precursor by catalytic hydrosilylation of the functional group precursor and hydrogen silsesquioxane resin or silsesquioxane resin. The catalytic hydrosilylation reaction is carried out using the same or similar process conditions at that described above for the catalytic hydrosilylation reaction between the hydrogen silsesquioxane resin and acid dissociable group precursor.

In one process the hydrogen silsesquioxane resin (A) may reacted with the functional group precursor to produce a resin having the formula

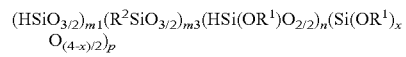

where $R^1$, n, p and x are as described previously, $R^2$ is a property modifying functional group, m3 has a value of 0.01 to 0.25, typically 0.05 to 0.15; and m1+m3≈m. This resin is then reacted with the acid dissociable group precursor to produce a resin having the formula

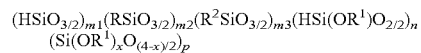

where R, $R^1$, $R^2$, n, p, m1, m2, and m3 and x are as described previously m1+m2+m3≈m. In an alternative process the silsesquioxane resin (C) may be reacted with the functional group precursor, followed by water to produce a resin have the formula

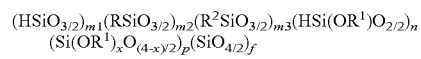

where R, $R^1$, $R^2$, n, p, m1, m2, and m3 and x are as described previously m1+m2+m3≈m. In an alternative process the hydrogen silsesquioxane resin (A) may be reacted with a mixture comprising both the functional group precursor and acid dissociable group precursor to produce a resin having the formula

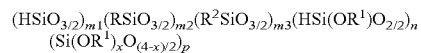

where R, $R^1$, $R^2$, n, p, m1, m2, and m3 and x are as described previously m1+m2+m3≈m. In a typical method the hydrogen silsesquioxane resin is reacted with the acid dissociable group precursor and the silsesquioxane resin is reacted with the functional group precursor.

Another embodiment of this invention is a photoresist composition comprising (A) the silsesquioxane resin described herein and (B) an acid generator. The photoresist may take the form of a negative or a positive photoresist and other components and additives may be present. Typically the silsesquioxane resin is present in the photoresist composition up to 99.5 wt. % based on the solids and the acid generator is typically present at 0.5-10 wt. % based on the solids contained in the composition. The photoresist composition may take the form a negative or a positive photoresist and other components and additives may also be present.

The acid generator is a compound that generates acid upon exposure to radiation. This acid then causes the acid dissociable group in the silsesquioxane resin to dissociate. Acid generators are well known in the art and are described in, for example, EP 1 142 928 A1. Acid generators may be exemplified by, but not limited to, onium salts, halogen-containing compounds, diazoketone compounds, sulfone compounds, sulfonate compounds and others.

Examples of onium salts include, but are not limited to, iodonium salts, sulfonium salts (including tetrahydrothiophenium salts), phosphonium salts, diazonium salts, and pyridinium salts.

Examples of halogen-containing compounds include, but are not limited to, mahaloalkyl group-containing hydrocarbon compounds, haloalkyl group-containing heterocyclic compounds, and others.

Examples of diazoketone compounds include, but are not limited to, 1,3-diketo-2-diazo compounds, diazobenzoquinone compounds, diazonaphthoquinone compounds, and others.

Examples of sulfone compounds, include, but are not limited to, β-ketosulfone, β-sulfonylsulfone, α-diazo compounds of these compounds, and others.

Examples of sulfonate compounds include, but are not limited to, alkyl sulfonate, alkylimide sulfonate, haloalkyl sulfonate, aryl sulfonate, imino sulfonate, and others.

The acid generator (b) may be used either individually or in combination of two or more. The preferred acid generators are sulfonated salts, in particular sulfonated salts with perfluorinated methide anions.

Other additives may be used in the photoresist composition. For example if the photoresist is a positive photoresist then the photoresist composition may include acid-diffusion controllers, surfactants, dissolution inhibitors, cross-linking agents, sensitizers, halation inhibitors, adhesion promoters, storage stabilizers, anti-foaming agents, coating aids, plasticizers and others. Typically, the sum of all additives (not including the acid generator) will comprise less than 20 percent of the solids included in the photoresist composition, alternatively less than 5 percent.

Typically the photoresist composition is delivered in a solvent. The choice of solvent is governed by many factors such as the solubility and miscibility of the silsesquioxane resin and acid generator, the coating process and safety and environmental regulations. Typical solvents include ether-, ester-, hydroxyl- and ketone-containing compounds. Examples of solvents include, but are not limited to, cyclopentanone, cyclohexanone, lactate esters such as ethyl lactate, alkylene glycol alkyl ether esters such as propylene glycol methyl ether acetate, alkylene glycol monoalkyl esters such as methyl cellosolve, butyl acetate, 2-ethoxyethanol, and ethyl 3-ethoxypropionate. Typically solvents for silsesquioxane resins include, but are not limited to cyclopentanone (CP), propylene glycol methyl ether acetate (PGMEA), ethyl lactate (EL), methyl isobutyl ketone (MIBK), methyl ethyl ketone (MEK), ethyl 3-tethoxypropionate, 2-heptanone or methyl n-amyl ketone (MAK), and/or any their mixtures.

The amount of solvent is typically present at 50 to 99.5 wt % the total photoresist composition (i.e. (A), (B), additives and solvent), alternatively, 80 to 95 wt %.

Another embodiment of the instant invention is a process for generating a resist image on a substrate. The process comprises the steps of: (a) coating a substrate with a film comprising the photoresist composition of the present invention; (b) imagewise exposing the film to radiation to produce an exposed film; and (c) developing the exposed film to produce an image.

Step (a) involves coating the substrate with a resist film comprising the photoresist composition. Typically the photoresist composition is delivered in a solvent to facilitate the coating process. Suitable substrates are ceramic, metallic or semiconductive, and preferred substrates are silicon-containing, including, for example, silicon dioxide, silicon nitride, silicon oxynitride, silicone carbide, and silicon oxycarbide. The substrate may or may not be coated with an organic or anti-reflective underlayer prior to deposition of the photoresist composition. Alternatively, a bilayer substrate may be employed wherein a photoresist composition of the invention forms an upper photoresist layer (i.e., the imaging layer) on top of a bilayer substrate comprised of a base layer and underlayer that lies between the upper photoresist layer and the base layer. The base layer of the bilayer substrate is comprised of a suitable substrate material, and the underlayer of the bilayer substrate is comprised of a material that is highly absorbing at the imaging wavelength and compatible with the imaging layer. Conventional underlayers include cross-linked poly(hydroxystyrene), polyesters, polyacrylates, fluorinated polymers, cyclic-olefin polymers and the like including diazonapthoquinone (DNQ)/novolak resist material.

The surface of the coated or uncoated, single or bilayer substrate is typically cleaned by standard procedures before the resist film is deposited thereon. The resist film can be coated on the substrate using techniques known in the art, such as spin or spray coating, or doctor blading. Typically the resist film is dried before the resist film is exposed to radiation, by heating to a temperature in the range of 30° C. to 200° C. for a short period of time (e.g. 20 to 90 seconds), typically on the order of approximately 1.0 minute. The resulting dried film has a thickness of 0.01 to 5.0 microns, alternatively 0.02 to 2.5 microns, alternatively 0.05 to 1.0 microns, and alternatively 0.10 to 0.20 microns.

The resist film is then imagewise exposed to radiation, i.e., UV, X-ray, e-beam, EUV, or the like. Typically ultraviolet radiation having a wavelength of 157 mm to 365 nm is used alternatively ultraviolet radiation having a wavelength of 157 m or 193 nm is used. Suitable radiation sources include mercury, mercury/xenon, and xenon lamps. The preferred radiation source is a KrF excimer laser or a $F_2$ excimer laser. At longer wavelength radiation is used, e.g., 365 nm, it is suggested to add a sensitizer to the photoresist composition to enhance absorption of the radiation. Full exposure of the photoresist composition is typically achieved with less than 100 mJ/cm$^2$ of radiation, alternatively with less than 50 mJ/cm$^2$ of radiation.

Upon exposure to radiation, the radiation is absorbed by the acid generator in the photoresist composition to generate free acid. When the photoresist composition is a positive photoresist, upon heating, the free acid causes cleavage of the acid dissociable groups that are present on the silsesquioxane resin. When the photoresist composition is a negative photoresist, the free acid causes the crosslinking agents to react with the silsesquioxane resin, thereby forming insoluble areas of exposed photoresist. After the photoresist composition has been exposed to radiation, the photoresist composition is typically heated to a temperature in the range of 30° C. to 200° C. for a short period of time, on the order of approximately 1 minute.

The exposed film is developed with a suitable developer solution to produce an image. Suitable developer solutions typically contain an aqueous base solution, preferably an aqueous base solution without metal ions, and optionally an organic solvent. One skilled in the art will be able to select the appropriate developer solution. Standard industry developer solutions contain bases such as tetramethylammonium hydroxide (TMAH), choline, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, pyrrole, piperidine, 1,8-diazabicyclo-[5.4.0]-7-undecene, and 1,5-diaza bicyclo-[4.3.0]-5-nonene. In positive photoresist applications, the exposed areas of the photoresist will be soluble, leaving behind the unexposed areas. In negative photoresist, the converse is true, i.e., the unexposed regions will be soluble to the developer while the exposed regions will remain. After the exposed film has been developed, the remaining resist film ("pattern") is typically washed with water to remove any residual developer solution.

The pattern may then be transferred to the material of the underlying substrate. In coated or bilayer photoresists, this will involve transferring the pattern through the coating that may be present and through the underlayer onto the base layer. In single layer photoresists the transfer will be made directly to the substrate. Typically, the pattern is transferred by etching with reactive ions such as oxygen, plasma, and/or oxygen/sulfurdioxide plasma Suitable plasma tools include, but are not limited to, electron cyclotron resonance (ECR), helicon, inductively coupled plasma, (ICP) and transmission-coupled plasma (TCP) system. Etching techniques are well known in the art and one skilled in the art will be familiar with the various commercially available etching equipments.

Thus, the photoresist compositions of the invention can be used to create patterned material layer structures such as metal wiring lines, holes for contacts or vias, insulation sections (e.g., damascene trenches or shallow trench isolation), trenches for capacitor structures, etc. as might be used in the design of integrated circuit devices. Such processes for making these features are known in the art.

The following examples are presented to further illustrate the invention, but should not be construed as limiting the invention. Although efforts have been made to ensure the accuracy with respect to numbers, some errors and possible deviations should be accounted for. Percentage is usually by weight, temperature is in ° C., and pressure is at atmosphere, unless indicated otherwise. All the chemicals used here were obtained either through a commercial vender or synthesized with known structure characterized to the best knowledge of the inventors. All NMR (1H, 13C, 19F, 29Si) data were acquired either on Varian Mercury 300 or Mercury 400 spectrometers.

EXAMPLES

Example 1

Hydrogen Silsesquioxane Resin (HSQ) Synthesis 100 grams of toluenesulfonic acid monohydrate (TSAM) solution prepared by sulfonating toluene using concentrated $H_2SO_4$ and fume $SO_3$ was added into a 500-ml flask equipped with a water condenser, thermometer, magnetic stir bar, and nitrogen bubbler. Then a solution of trichlorosilane (10 grams, 0.075 mole) in 50 grams of toluene was added dropwise into the flask with consistent strong stirring. After the addition, the mixture was washed at least 3 times with deionized (DI) water, and the organic phase was collected. Then the solvent was stripped off with a rotatory evaporator under reduced pressure to give a hydrogen silsesquioxane resin solution with solid content in the range of 5 to 25%.

Example 2

HSQ and t-Butyl 2-Trifluoromethyl Acrylate resin

An olefin solution was separately prepared by mixing ~0.1 mole of t-butyl 2-trifluoromethyl acrylate (TBTFMA) with anhydrate toluene (50:50). To this mixture ~200 ppm 1,3-diethenyl-1,1,3,3-tetramethyldisiloxane complex (platinum, concentrated) was added.

The olefin solution was charged into a flask equipped with a water condenser, thermometer, magnetic stir bar, and nitrogen bubbler. After nitrogen purge, the HSQ solution prepared in Example 1 (containing ~0.33 mole of HSQ solid) was slowly added into the olefin solution. After the addition, the system was refluxed for approximately 4 hours while stirring moderately. The hydrosilylation reaction was monitored using 1H NMR until the olefin peaks disappeared completely.

Final resin solutions with a solid content ranging from 4 to 45 wt % were prepared by solvent exchange to a desired solvent such as propylene glycol methyl ether acetate (PG-MEA), ethyl lactate (EL), methyl isobutyl ketone (MIBK) or methyl n-amyl ketone (MAK). The molecular weight of the resin ranged from 3,000 to 25,000.

Example 3

HSQ and Bicyclo[2,2,1]hept-5-ene-2-t-Butylcarboxylate resin

An olefin solution was separately prepared by mixing approximately 0.1 moles of bicyclo[2,2,1]hept-5-ene-2-butylcarboxylate with anhydrate toluene (50:50). To this mixture 200 ppm 1,3-diethenyl-1,1,3,3-tetramethyldisiloxane complex (platinum, concentrated) was added.

The olefin solution was charged into a flask equipped with a water condenser, thermometer, magnetic stir bar, and nitrogen bubbler. After nitrogen purge, the HSQ solution prepared in Example 1 (containing ~0.33 mole of HSQ) was slowly added into the olefin solution. After the addition, the system was refluxed for 8 hours while stirring moderately. The hydrosilylation reaction was monitored using 1H NMR until the olefin peaks disappeared completely.

The final resin solution with a solid content ranging from 4 to 45 wt % was prepared by either solvent exchange to a desired solvent such as propylene glycol methyl ether acetate (PGMEA), ethyl lactate (EL), methyl isobutyl ketone (MIBK) or methyl n-amyl ketone (MAK).

Example 4

HSQ and cis-5-Norbornene-2,3-dicarboxylic Anhydride resin

An olefin solution was separately prepared by mixing ~0.10 mole of cis-5-Norbornene -2,3-dicarboxylic anhydride with anhydrate toluene (1:10). To this mixture ~200 ppm 1,3-diethenyl-1,1,3,3-tetramethyldisiloxane complex (platinum—concentrated) was added.

The olefin solution was charged into a flask equipped with a water condenser, thermometer, magnetic stir bar, and nitrogen bubbler. After nitrogen purge, the HSQ solution prepared in Example 1 (containing ~0.33 mole of HSQ,) was slowly added into the olefin solution. After the addition, the system was refluxed for 3 hours while stirring moderately. The hydrosilylation reaction was monitored using 1H NMR until the olefin peaks disappeared completely.

The final resin solution with a solid content ranging from 4 to 45 wt % a was prepared by either solvent exchange to a desired solvent such as propylene glycol methyl ether acetate (PGMEA), ethyl lactate (EL), methyl isobutyl ketone (MIBK).

Example 5

193 nm Positive Resist Evaluation

A photoresist composition was prepared by mixing until homogeneous 15 parts silsesquioxane resin prepared in Example 3, 0.3 parts photoacid generator, either $(C_6H_5)_3S^+$ $SbF_6^-$ or $(p-(CH_3)_3CC_6H_4)_3C^-(SO_2CF_3)_3$ obtained from 3M) and 84.7 parts PGMEA (electronic grade from General Chemical).

The formulated photoresist solution was filtered through a 0.2 micron syringe filter, and then spin-coated onto a 6" silicon wafer. The coated wafer was baked at 130° C. for 60 seconds before exposure at 248 nm or 193 nm with dose ranged from 8 to 100 mJ/cm². The film was then baked at 130° C. for 90 seconds, and developed with 0.263 N tetra-methyl ammonium hydroxide (MF CD26 from Shipley). High-resolution positive images with high contrast and low line-edge roughness (LER) were obtained.

Example 6

193 nm Positive Bilayer Application

A photoresist composition was prepared by mixing until homogeneous 15 parts silsesquioxane resin prepared in Example 3, 0.3 parts photoacid generator, either $(C_6H_5)_3S^+ SbF_6^-$ or $(p-(CH_3)_3CC_6H_4)_3C^-(SO_2CF_3)_3$ obtained from 3M) and 84.7 parts PGMEA (electronic grade from General Chemical).

A 6" silicon wafer is pre-coated with an organic BARC layer (e.g. Brewer ARC 27), followed by proper baking (e.g. 200° C. for 90 seconds) for solvent removal and curing. The formulated photoresist solution was then spin-coated onto the wafer above. The resist coated wafer was baked (PAB) at 100° C. for 60 seconds before exposure at 193 nm with dose ranged from 8 to 100 mJ/cm². The film was then baked at 130° C. for 90 seconds (PEB), and developed with 0.263 N tetra-methyl ammonium hydroxide (MF CD26 from Shipley). High-resolution positive images with high contrast and low line-edge roughness (LER) were obtained.

The invention claimed is:

1. A silsesquioxane resin comprising $HSiO_{3/2}$ units and $RSiO_{3/2}$ units where R is an acid dissociable group having the formula

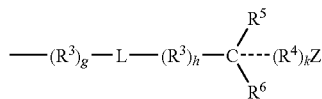

wherein each $R^3$ are independently a linking group;
$R^4$ a second linking group;
L is selected from the group consisting of linear or branch alkylene groups having 1 to 10 carbon atoms, fluoroalkylene groups having 2 to 20 carbon atoms, substituted and unsubstituted arylene groups, substituted and unsubstituted cycloalkylene groups, and substituted and unsubstituted alkarylene groups;
$R^5$ is hydrogen, linear or branched alkyl or fluoroalkyl;
$R^6$ is alkyl or fluoroalkyl;
Z is an acid-cleavable group; and
g may have a value of 0 or 1 and
h may have the value of 0 or 1; and
k may have the value of 0 or 1.

2. A silsesquioxane resin as claimed in claim 1 wherein the silsesquioxane resin has the formula $(HSiO_{3/2})_a(RSiO_{3/2})_b$ wherein a has a value of 0.2 to 0.9, b has a value of 0.1 to 0.8, and $0.9 \leq a+b \leq 1.0$.

3. The silsesquioxane resin as claimed in claim 2 wherein a has a value of 0.6 to 0.8 and b has a value of 0.2 to 0.6.

4. A photoresist composition comprising (A) the silsesquioxane resin as claimed in claim 2 and (B) an acid generator.

5. The silsesquioxane resin as claimed in claim 1 wherein the silsesquioxane resin has the formula $(HSiO_{3/2})_a (RSiO_{3/2})_b(HSi(OR^1)O_{2/2})_c$ wherein $R^1$ is selected from H or a linear or branched $C_1$ to $C_6$ alkyl group, a has a value of 0.2 to 0.9, b has a value of 0.1 to 0.8, c has a value of 0.01 to 0.4, and $0.9 \leq a+b+c \leq 1.0$.

6. The silsesquioxane resin as claimed in claim 5 wherein a has a value of 0.4 to 0.8, b has a value of 0.2 to 0.6 and c has a value of 0.05 to 0.15.

7. A photoresist composition comprising (A) the silsesquioxane resin as claimed in claim 5 and (B) an acid generator.

8. The silsesquioxane resin as claimed in claim 1 wherein the resin has the formula $(HSiO_{3/2})_a(RSiO_{3/2})_b(Si(OR^1)_xO_{(4-x)/2})_d$ wherein $R^1$ is selected from H or a linear or branched $C_1$ to $C_6$ alkyl group, a has a value of 0.2 to 0.9, b has a value of 0.1 to 0.8, d has a value of 0.05 to 0.45, $0.9 \leq a+b+d \leq 1.0$, and x has a value of 0 to 3.

9. The silsesquioxane resin as claimed in claim 8 wherein a has a value of 0.4 to 0.8, b has a value of 0.2 to 0.6 and d has a value of 0.1 to 0.25.

10. A photoresist composition comprising (A) the silsesquioxane resin as claimed in claim 8 and (B) an acid generator.

11. The silsesquioxane resin as claimed in claim 1 wherein the resin has the formula $(HSiO_{3/2})_a(RSiO_{3/2})_b(HSi(OR^1)O_{2/2})_c(Si(OR^1)_xO_{(4-x)/2})_d$ wherein $R^1$ is selected from H or a linear or branched $C_1$ to $C_6$ alkyl group, a has a value of 0.2 to 0.9, b has a value of 0.1 to 0.8, c has a value of 0.01 to 0.4, d has a value of 0.05 to 0.45, $0.9 \leq a+b+c+d \leq 1.0$ and x has a value of 0 to 3.

12. The silsesquioxane resin as claimed in claim 11 wherein a has a value of 0.4 to 0.8, b has a value of 0.2 to 0.6, c has a value of 0.05 to 0.15 and d has a value of 0.1 to 0.25.

13. A photoresist composition comprising (A) the silsesquioxane resin as claimed in claim 11 and (B) an acid generator.

14. The silsesquioxane resin as claimed in claim 1 wherein the resin has the formula $(HSiO_{3/2})_a(RSiO_{3/2})_b(R^2SiO_{3/2})_e$ wherein $R^2$ is a property modifying functional group, a has a value of 0.2 to 0.9, b has a value of 0.1 to 0.8, e has a value of 0.01 to 0.25, and $0.9 \leq a+b+e \leq 1.0$.

15. The silsesquioxane resin as claimed in claim 14 wherein a has a value of 0.4 to 0.8, b has a value of 0.2 to 0.6, and e has a value of 0.05 to 0.15.

16. A photoresist composition comprising (A) the silsesquioxane resin as claimed in claim 14 and (B) an acid generator.

17. The silsesquioxane resin as claimed in claim 1 wherein the resin has the formula $(HSiO_{3/2})_a(RSiO_{3/2})_b(HSi(OR^1)O_{2/2})_c(R^2SiO_{3/2})_e$ wherein $R^1$ is selected from H or a linear or branched $C_1$ to $C_6$ alkyl group; $R^2$ is a property modifying functional group; a has a value of 0.2 to 0.9, b has a value of 0.1 to 0.8, c has a value of 0.01 to 0.4, e has a value of 0.01 to 0.25, and $0.9 \leq a+b+c+e \leq 1.0$.

18. The silsesquioxane resin as claimed in claim 17 wherein a has a value of 0.4 to 0.8, b has a value of 0.2 to 0.6, c has a value of 0.05 to 0.15 and e has a value of 0.05 to 0.15.

19. A photoresist composition comprising (A) the silsesquioxane resin as claimed in claim 17 and (B) an acid generator.

20. The silsesquioxane resin as claimed in claim 1 wherein the resin has the formula $(HSiO_{3/2})_a(RSiO_{3/2})_b(Si(OR^1)_xO_{(4-x)/2})_d(R^2SiO_{3/2})_e$ wherein $R^1$ is selected from H or a linear or branched $C_1$ to $C_6$ alkyl group, $R^2$ is a property modifying functional group, a has a value of 0.2 to 0.9, b has a value of 0.1 to 0.8, , d has a value of 0.05 to 0.45, e has a value of 0.01 to 0.25, $0.9 \leq a+b+d+e \leq 1.0$ and x has a value of 0 to 3.

21. The silsesquioxane resin as claimed in claim 20 wherein a has a value of 0.4 to 0.8, b has a value of 0.2 to 0.6 and d has a value of 0.1 to 0.25 and e has a value of 0.05 to 0.15.

22. A photoresist composition comprising (A) the silsesquioxane resin as claimed in claim 20 and (B) an acid generator.

23. The silsesquioxane resin as claimed in claim 1 wherein the resin has the formula $(HSiO_{3/2})_a(RSiO_{3/2})_b(HSi(OR^1)O_{2/2})_c(Si(OR^1)_xO_{(4-x)/2})_d(R^2SiO_{3/2})_e$ wherein $R^1$ is selected from H or a linear or branched $C_1$ to $C_6$ alkyl group, $R^2$ is a property modifying functional group a has a value of 0.2 to 0.9, b has a value of 0.1 to 0.8, c has a value of 0.01 to 0.4, d has a value of 0.05 to 0.45, e has a value of 0.01 to 0.25, $0.9 \leq a+b+c+d+e \leq 1.0$ and x has a value of 0 to 3.

24. The silsesquioxane resin as claimed in claim 23 wherein a has a value of 0.4 to 0.8, b has a value of 0.2 to 0.6, c has a value of 0.05 to 0.15 and d has a value of 0.1 to 0.25 and e has a value of 0.05 to 0.15.

25. A photoresist composition comprising (A) the silsesquioxane resin as claimed in claim 23 and (B) an acid generator.

26. The silsesquioxane resin as claimed in claim 1 wherein Z is selected from esters of the formula —$COOR^7$, carbonates of the formula —$OCOOR^8$, ethers of the formula —$OR^9$, wherein $R^7$, $R^8$ and $R^9$ are selected to render Z acid-cleavable.

27. The silsesquioxane resin as claimed in claim 26 wherein Z is an ester of the formula —$COOR^7$ wherein $R^7$ is a tertiary alkyl group.

28. The silsesquioxane resin as claimed in claim 1 wherein the resin has the formula $(HSiO_{3/2})_a(RSiO_{3/2})_b$ where a has a value of 0.4 to 0.9, b has a value of 0.1 to 0.6 and $0.9 \leq a+b \leq 1.0$.

29. The silsesquioxane resin as claimed in claim 1 wherein the resin has the formula $(HSiO_{3/2})_a(RSiO_{3/2})_b(R^1OSiO_{3/2})_c(SiO_{4/2})_d$ where $R^1$ is H; a has a value of 0.5 to 0.7, b has a value of 0.2 to 0.45, c has a value of 0.05 to 0.2, d has a value of 0.01 to 0.15, and $0.9 \leq a+b+c+d \leq 1.0$.

30. The silsesquioxane resin as claimed in claim 1 wherein the resin has the formula $(HSiO_{3/2})_a(RSiO_{3/2})_b(HSi(OR^1)O_{2/2})_c(Si(OR^1)_xO_{(4-x)/2})_d(R^2SiO_{3/2})_e$ where $R^1$ is H; $R^2$ is selected from bicyclo[2,2,1]hept-5-ene-2-(1,1,1-trifluoro-2-trifluoromethylpropane-2-ol, 2-trifluoromethyl bicyclo[2,2,1]hept-5-ene-2-ol, 3,3,3-trifluoropropane-2-ol, 2-trifluoromethyl-3,3-difluoro-bicyclo[2,2,1]hept-5-en-2-ol; a has a value of 0.4 to 0.6, b has a value of 0.2 to 0.45, c has a value of 0.05 to 0.20, d has a value of 0.01 to 0.15, e has a value of 0.01 to 0.25 and $0.9 \leq a+b+c+d+e \leq 1.0$ and x has a value of 0 to 3.

31. A photoresist composition comprising (A) the silsesquioxane resin as claimed in claim 1 and (B) an acid generator.

32. The photoresist composition as claimed in claim 31 wherein the acid generator is selected from onium salts, halogen-containing compounds, diazoketone compounds, sulfone compounds, sulfonate compounds.

33. The photoresist composition as claimed in claim 32 wherein the acid generator is a sulfonate compound.

34. The photoresist composition as claimed in claim 31 wherein the resin is present in an amount up to 99.5 wt% based on solids and the acid generator is present in an amount of 0.5 to 10 wt% based on solids.

35. The photoresist composition as claimed in claim 31 wherein there is additionally present at least one additive selected from acid-diffusion controllers, surfactants, dissolution inhibitors, cross-linking agents, sensitizers, halation inhibitors, adhesion promoters, storage stabilizers, antifoaming agents, coating aids, and plasticizers.

36. The photoresist composition as claimed in claim 35 wherein the additive is present in amount of less than 20 wt % based on solids.

37. The photoresist composition as claimed in claim 31 wherein the composition is delivered in a solvent.

38. The photoresist composition as claimed in claim 37 wherein the solvent is selected from ether-, ester-, hydroxyl- and ketone-containing compounds 39. The photoresist composition as claimed in claim 38 wherein the solvent is present in an amount of 50 to 99.5 wt % based on the weight of the total photoresist composition.

40. A process for generating a resist image on a substrate comprising (a) coating a substrate with a film comprising the photoresist composition as claimed in claim 37; (b) imagewise exposing the film to radiation; and (c) developing the exposed film to produce an image.

41. The process as claimed in claim 40 wherein the film is dried before exposure to the radiation.

42. A process for generating a resist image on a substrate comprising (a) coating a substrate with a film comprising the photoresist composition as claimed in claim 31; (b) imagewise exposing the film to radiation to produce; and (c) developing exposed film to produce an image.

43. The process as claimed in claim 42 wherein film is coated on the substrate by spin-coating.

44. The process as claimed in claim 42 wherein the film has a thickness of 0.01 to 5 microns.

45. The process as claimed in claim 42 wherein the radiation is selected from UV, X-ray, e-beam and EUV.

46. The process as claimed in claim 42 wherein the radiation has a wavelength in the range of 157 nm to 365 nm.

47. The process as claimed in claim 42 wherein the radiation has a wavelength of 157 nm or 193 nm.

48. The process as claimed in claim 42 wherein the exposed film is heated at a temperature of 30° C. to 200° C. prior to being developed.

49. The process as claimed in claim 42 wherein the exposed film is developed by contacting the exposed film with an aqueous base solution.

50. The silsesquioxane resin as claimed in claim 1 wherein the resin has the formula $(HSiO_{3/2})_a(RSiO_{3/2})_b(HSi(OR^1)O_{2/2})_c(Si(OR^1)_xO_{(4-x)/2})_d(R^2SiO_{3/2})_e(SiO_{4/2})_f$ $R^1$ is selected from H or a linear or branched $C_1$ to $C_6$ alkyl group, $R^2$ is a property modifying functional group, a has a value of 0.2 to 0.9, b has a value of 0.1 to 0.8, c has a value of 0.01 to 0.4, d has a value of 0.05 to 0.45, e has a value of 0.01 to 0.25, $0.0 \leq f \leq 0.20$, $0.9 \leq a+b+c+d+e+f \leq 1.0$ and x has a value of 0 to 3.

51. The silsesquioxane resin as claimed in claim 50 wherein a has a value of 0.4 to 0.8, b has a value of 0.2 to 0.6, c has a value of 0.05 to 0.15 and d has a value of 0.1 to 0.25, e has a value of 0.05 to 0.15.

52. A method for preparing a silsesquioxane resin comprising reacting
(I) a hydrogen silsesquioxane resin having the formula $(HSiO_{3/2})_m(HSi(OR^1)O_{2/2})_n(Si(OR^1)_xO_{(4-x)/2})_p$ where $R^1$ is selected from H or a linear or branched $C_1$ to $C_6$ alkyl group, m has a value of 0.7 to 1.0, n has a value of 0 to 0.4, p has a value of 0 to 0.45, $0.9 \leq m+n+p \leq 1.0$ and x has a value of 0 to 3; with
(II) an acid dissociable group precursor to produce
(III) a silsesquioxane resin having the general formula $(HSiO_{3/2})_{m1}(RSiO_{3/2})_{m2}(HSi(OR^1)O_{2/2})_n(Si(OR^1)_xO_{(4-x)/2})_p$ where R is an acid dissociable group; m2 has a value of 0.1 to 0.8, and m1+m2=m.

53. The method as claimed in claim 52 wherein the reacting is carried out by the catalytic hydrosilylation of (I) and (II).

54. The method as claimed in claim 52 wherein the acid dissociable group precursor is selected from t-butyl ester of norbornene, t-butyl 2-trifluoromethyl acrylate, and bicyclo[2,2,1]hept-5-ene-2-t-butylcarboxylate.

55. The method as claimed in claim 52 wherein the reacting is carried out in the presence of a solvent.

56. The method as claimed in claim 55 wherein the solvent is selected from alcohols, aromatic hydrocarbons, alkanes, ketones, esters; glycol ethers; siloxanes,2-ethoxyethanol, propylene glycol methyl ether acetate (PGMEA), cyclohexanone, and 1,2-diethoxyethane.

57. The method as claimed in claim 52 wherein the hydrogen silsesquioxane resin is first reacted with functional group precursor.

58. The method as claimed in claim 57 wherein the reacting is carried out by the catalytic hydrosilylation of (I) and the functional group precursor.

59. The method as claimed in claim 52 wherein the silsesquioxane resin (III) is further reacted with a functional group precursor.

60. The method as claimed in claim 59 wherein the reacting is carried out by the catalytic hydrosilylation of (III) and the functional group precursor.

61. The method as claimed in claim 52 wherein (I) is reacted with a mixture comprising (II) and a functional group precursor.

* * * * *